United States Patent
Nakamura et al.

(10) Patent No.: US 6,821,566 B2
(45) Date of Patent: Nov. 23, 2004

(54) METHOD AND APPARATUS FOR FORMING INSULATING FILM CONTAINING SILICON OXY-NITRIDE

(75) Inventors: Genji Nakamura, Nirasaki (JP); Yoshihide Tada, Nirasaki (JP); Masayuki Imai, Nirasaki (JP); Asami Suemura, Nirasaki (JP); Shingo Hishiya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 49 days.

(21) Appl. No.: 10/299,707

(22) Filed: Nov. 20, 2002

(65) Prior Publication Data

US 2003/0068437 A1 Apr. 10, 2003

Related U.S. Application Data

(63) Continuation of application No. 09/656,432, filed on Sep. 6, 2000, now abandoned.

(30) Foreign Application Priority Data

Sep. 7, 1999 (JP) ............................................ 11-253348

(51) Int. Cl.[7] .......................... C23C 14/06; C23C 16/30; H01L 21/31; H01L 21/471
(52) U.S. Cl. ............................ 427/255.27; 427/255.18; 427/255.26; 427/255.29; 438/786
(58) Field of Search ....................... 427/255.11, 255.18, 427/255.23, 255.26, 255.27, 255.29, 255.4; 438/778, 786

(56) References Cited

U.S. PATENT DOCUMENTS

| | | | | |
|---|---|---|---|---|
| 4,980,307 A | * | 12/1990 | Ito et al. ..................... | 438/591 |
| 5,225,032 A | * | 7/1993 | Golecki ........................ | 117/90 |
| 5,254,506 A | * | 10/1993 | Hori ............................ | 438/769 |
| 5,541,141 A | * | 7/1996 | Cho ............................ | 438/770 |
| 5,777,300 A | | 7/1998 | Homma et al. | |
| 5,876,796 A | * | 3/1999 | Regolini et al. ....... | 427/255.17 |
| 5,935,650 A | | 8/1999 | Lerch et al. | |
| 6,171,104 B1 | * | 1/2001 | Saito et al. .................. | 432/18 |
| 6,211,098 B1 | * | 4/2001 | Twu et al. ................... | 438/787 |
| 6,225,171 B1 | * | 5/2001 | Yu et al. ...................... | 438/296 |
| 6,239,044 B1 | * | 5/2001 | Kashiwagi et al. ......... | 438/787 |
| 6,258,731 B1 | * | 7/2001 | Ando .......................... | 438/763 |
| 6,303,520 B1 | * | 10/2001 | Kwong et al. .............. | 438/769 |
| 6,468,926 B1 | * | 10/2002 | Irino et al. .................. | 438/773 |
| 2001/0034090 A1 | * | 10/2001 | Joo ............................. | 438/197 |

FOREIGN PATENT DOCUMENTS

| | | | |
|---|---|---|---|
| JP | 3-160720 | | 7/1991 |
| JP | 3-257828 | | 11/1991 |
| JP | 2000-183055 A | * | 6/2000 |
| TW | 365053 | | 7/1999 |

OTHER PUBLICATIONS

C. Diaz, et al., Symposium on VLSI Technology Digest of Technical Papers, pp. 49–50, "A Novel Low–Temperature Gate Oxynitride for CMOS Technologies", 1997.
Y. Okada, et al., Symposium on VLSI Technology Digest of Technical Papers, pp. 105–106, "Gate Oxynitride Grown in Nitric Oxide (NO)", 1994.
M. Fujiwara, et al., Symposium on VLSI Technology Digest of Technical Papers, pp. 121–122, "New Optimization Guidelines for Sub–0.1 $\mu$m CMOS Technologies with 2 nm No Gate Oxynitrides", 1999.

* cited by examiner

*Primary Examiner*—Shrive P. Beck
*Assistant Examiner*—Wesley D. Markham
(74) *Attorney, Agent, or Firm*—Oblon, Spivak, McClelland, Maier & Neustadt, P.C.

(57) ABSTRACT

A method of forming an insulating film containing silicon oxy-nitride includes a loading step, temperature raising step, oxidation step, cycle purge step, and annealing step, in this order. The temperature raising step is performed while supplying nitrogen gas and oxygen gas for preventing a silicon layer surface from being nitrided, at a supply ratio 100:1 to 1000:1. The oxidation step is performed at a temperature of 700 to 950° C. while supplying a gas that contains 1 to 5 vol % of water vapor and 95 to 99 vol % of nitrogen gas, to form a silicon oxide film. The annealing step is performed at a temperature of 800 to 950° C. while supplying a gas that contains 10 to 100 vol % of nitrogen monoxide gas, to convert a portion of the silicon oxide film into silicon oxy-nitride.

20 Claims, 5 Drawing Sheets

METHOD AND APPARATUS FOR FORMING INSULATING FILM CONTAINING SILICON OXY-NITRIDE

CROSS-REFERENCE TO RELATED APPLICATIONS

This application is a continuation of parent U.S. application Ser. No. 09/656,432 filed Sep. 6, 2000 now abandoned, the entire contents of which are incorporated herein by reference.

BACKGROUND OF THE INVENTION

The present invention relates to a method and apparatus for forming an insulating film containing silicon oxy-nitride on a silicon layer exposed to the surface of a target substrate.

With micropatterning of semiconductor devices, insulating films used in these devices, e.g., the gate insulating film and the like of a MOSFET are being more and more thinned. Generally, as the film thickness decreases, a silicon oxide film ($SiO_2$ film) readily increases the initial percentage of insulation defect or deteriorates the electrical characteristics such as the dielectric breakdown characteristic with time or the transistor characteristic. Also, in a post-annealing step, boron (B) as a dopant of a $p^+$-polysilicon electrode penetrates to the substrate through the silicon oxide film.

The electrical characteristics thus deteriorate presumably because unbonded hands (dangling bonds) exist in the interface between the oxide film and an underlying silicon film and these dangling bonds are closely related to the electrical film quality of the oxide film. Hence, a method is known which forms an oxide film by oxidizing the surface of a silicon (Si) film and anneals the oxide film at a high temperature in a nitrogen ($N_2$) gas atmosphere or in a gas mixture atmosphere of nitrogen gas and ammonia gas, thereby improving the film quality. This method requires a high temperature of 1,000° C. or more to improve the electrical characteristics, so a large heat history accumulation (thermal budget) may occur for the formed film.

On the other hand, Jpn. Pat. Appln. KOKAI Publication No. 5-251428 (Jpn. Patent No. 2793416) has disclosed a method of forming a silicon oxy-nitride film by forming a silicon oxide film by dry-oxidizing a silicon substrate and processing the oxide film with a nitrogen-containing oxidizing gas in a lamp heating type single wafer processing apparatus capable of rapid heating.

More specifically, a silicon substrate is first loaded into a process chamber. While an oxidizing gas not containing nitrogen, e.g., dry oxygen gas ($O_2$ gas) is caused to flow, this silicon substrate is oxidized by heating at about 1,000° C., thereby forming a silicon oxide film. The heating of the substrate is rapid heating done at a heating rate of from 50 to 200° C./sec by an infrared lamp. The temperature retention time for the oxidation at 1,000° C. is set to about 10 sec. Also, the processing pressure for the oxidation is set to about 760 Torr.

Subsequently, with the silicon substrate kept at about 1,000° C. in the same process chamber, the process chamber is once evacuated, and the silicon oxide film is processed while an oxidizing gas containing nitrogen is caused to flow into the process chamber. In this manner, the silicon oxide film is converted into a silicon oxy-nitride film. The nitrogen-containing oxidizing gas herein used is at least one gas selected from the group consisting of nitrogen monoxide (NO), nitrogen dioxide ($NO_2$), and dinitrogen monoxide ($N_2O$). The temperature retention time for the oxy-nitriding at 1,000° C. is set to about 30 sec. The processing pressure for the oxy-nitriding is set to about 760 Torr.

The method described in Jpn. Pat. Appln. KOKAI Publication No. 5-251428 uses rapid heating. Hence, the method improves the problem of thermal budget as compared to the former method. However, this method is unsuited to the formation of thin films and cannot control the film thickness and the film quality with excellent reproducibility.

BRIEF SUMMARY OF THE INVENTION

It is an object of the present invention to improve the controllability and reproducibility of the film thickness and the film quality (particularly the electrical characteristics) in a technology of forming a thin insulating film at least partially consisting of silicon oxy-nitride.

It is another object of the present invention to provide a method suited to a hot wall type processing apparatus, particularly a vertical heat-treating apparatus for performing batch processing, and an apparatus for practicing the method.

According to a first aspect of the present invention, there is provided a method of forming an insulating film containing silicon oxy-nitride, comprising a loading step of loading a target substrate into a process chamber, the substrate having a silicon layer exposed to a surface, an oxidation step of setting an atmosphere in the process chamber at a first heating temperature and a first pressure for a first processing time, and supplying a first processing gas for oxidation into the process chamber to oxidize a surface of the silicon layer, thereby forming a silicon oxide film on the silicon layer, the first processing gas containing 1 to 5 vol % of water vapor and 95 to 99 vol % of nitrogen gas, and an annealing step of setting the atmosphere in the process chamber at a second heating temperature and a second pressure for a second processing time after the silicon oxide film is formed, and supplying a second processing gas for nitriding into the process chamber to convert at least a portion of the silicon oxide film into silicon oxy-nitride, the second heating temperature being 800 to 950° C., and the second processing gas containing 10 to 100 vol % of nitrogen monoxide gas.

According to a second aspect of the present invention, there is provided an apparatus for forming an insulating film containing silicon oxy-nitride on a silicon layer exposed to a surface of a target substrate, comprising an airtight process chamber, a holding member for holding the substrate in the process chamber, a gas supply system for supplying a processing gas into the process chamber, an exhaust system for vacuum-exhausting the process chamber, a heater for heating an atmosphere in the process chamber, and a controller for controlling the gas supply system, the exhaust system, and the heater, wherein the controller is so arranged as to perform an oxidation step of setting the atmosphere in the process chamber accommodating the substrate at a first heating temperature and a first pressure for a first processing time, and supplying a first processing gas for oxidation into the process chamber to oxidize a surface of the silicon layer, thereby forming a silicon oxide film on the silicon layer, the first processing gas containing 1 to 5 vol % of water vapor and 95 to 99 vol % of nitrogen gas, and an annealing step of setting the atmosphere in the process chamber at a second heating temperature and a second pressure for a second processing time after the silicon oxide film is formed, and supplying a second processing gas for nitriding into the process chamber to convert at least a portion of the silicon oxide film into silicon oxy-nitride, the second heating temperature being 800 to 950° C., and the second processing gas containing 10 to 100 vol % of nitrogen monoxide gas.

In the present invention, water vapor is used in oxidation. Therefore, it is possible to obtain a wet oxide film having little distortion in the vicinity of the $SiO_2/Si$ interface and good electrical characteristics compared to a dry oxide film. In addition, the oxidation rate can be adjusted by mixing nitrogen gas in the water vapor. This can improve the film quality of the wet oxide film and also improve the controllability and reproducibility of the film thickness and the film quality. Note that wet oxidation cannot be used in a cold wall type single wafer processing apparatus using lamp heating, because byproducts such as $NHO_3$ (nitric acid) may be produced.

The wet oxide film is annealed subsequently to the oxidation. In this annealing, the wet oxide film is annealed in an atmosphere containing nitrogen monoxide gas. Hence, nitrogen enters into the $SiO_2/Si$ interface, and dangling bonds in this interface terminate by nitrogen of the nitrogen monoxide gas and decrease (i.e., silicon oxy-nitride forms). In this way, the electrical characteristics of the high-quality wet oxide film further improve by the formation of the silicon oxy-nitride.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
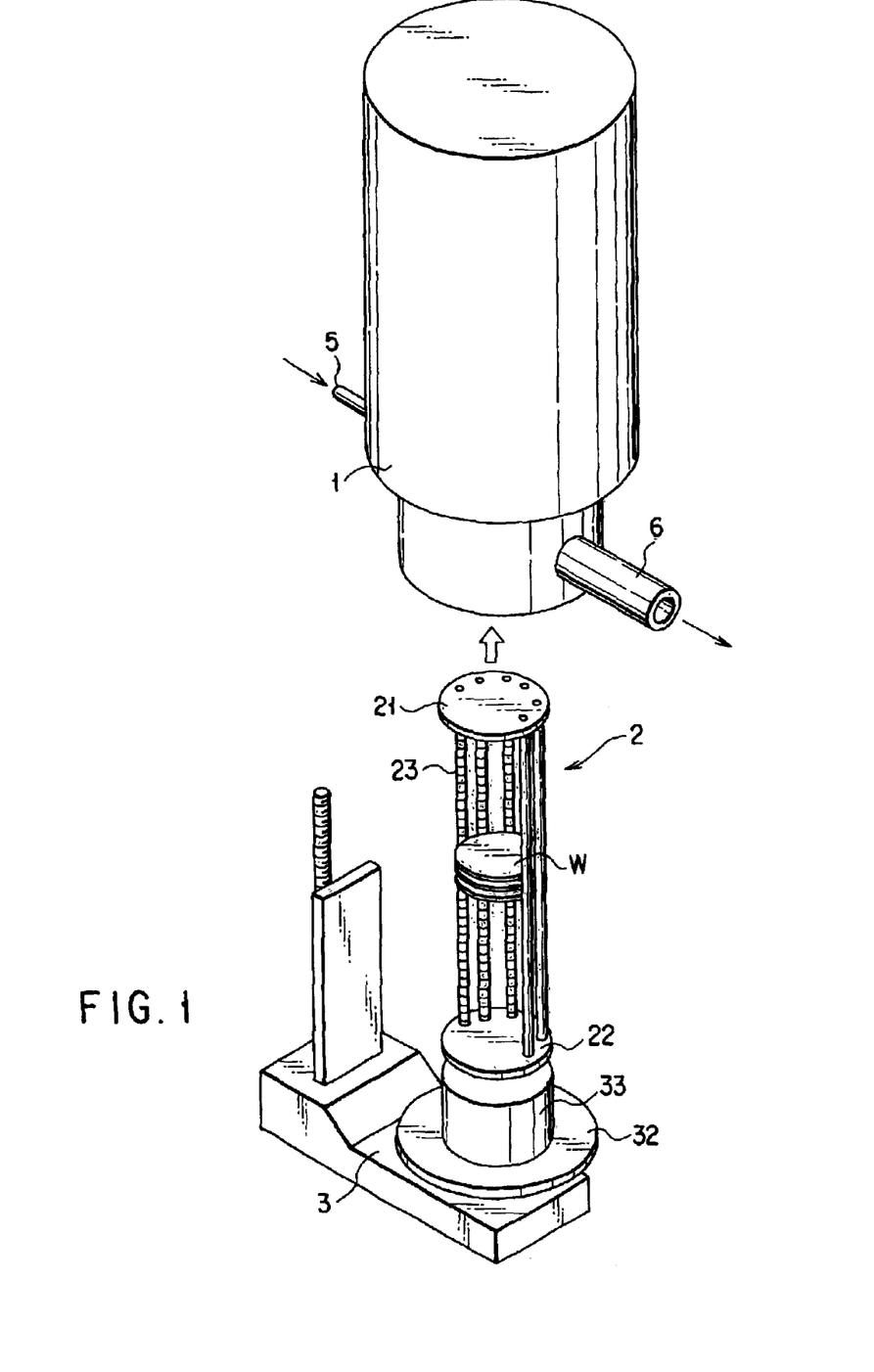
FIG. 1 is a perspective view schematically showing a vertical heat-treating apparatus according to an embodiment of the present invention.
Figure 2:
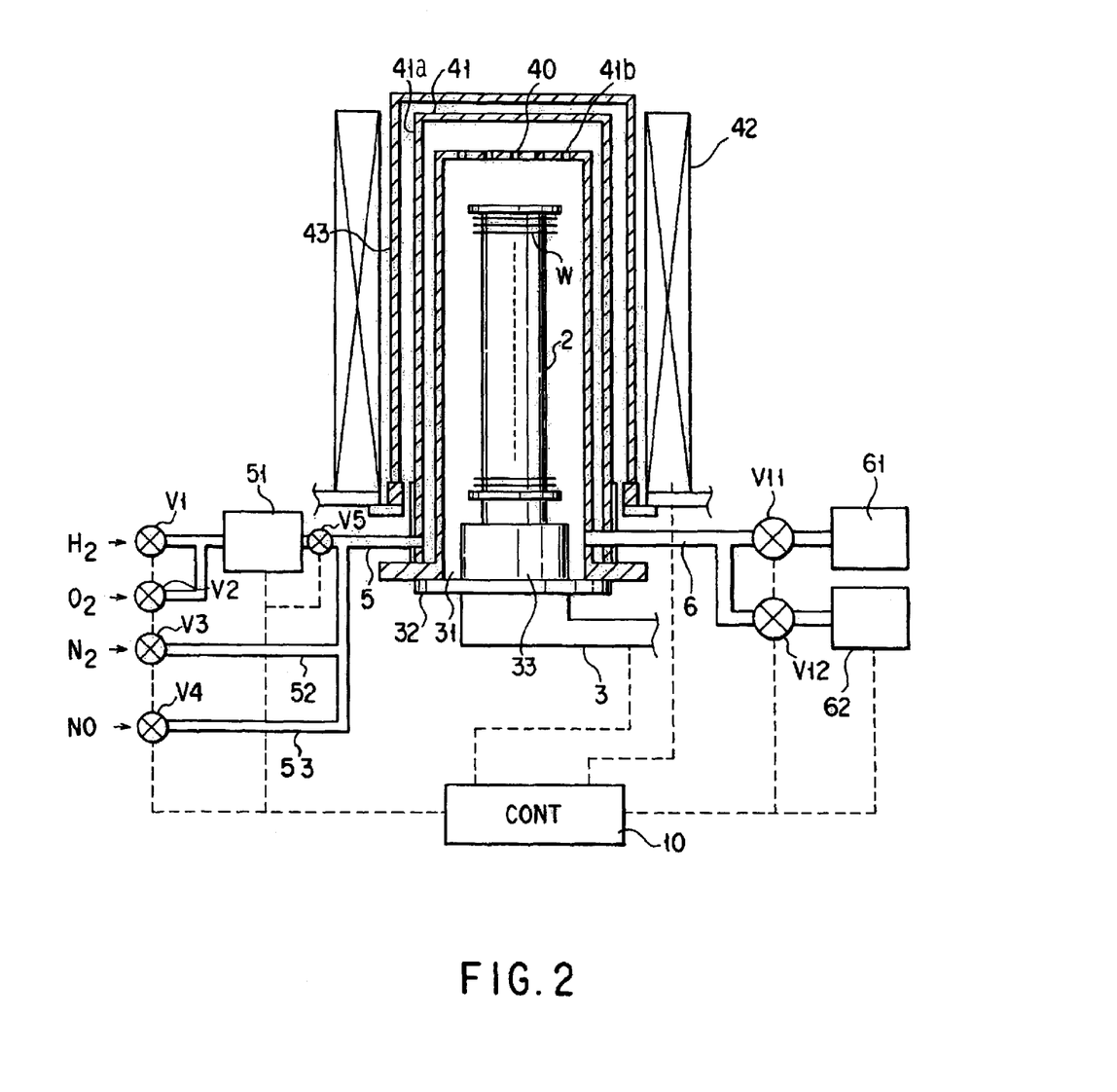
FIG. 2 is a sectional view schematically showing the vertical heat-treating apparatus shown in FIG. 1.

FIGS. 1 and 2 are a perspective view and a sectional view, respectively, schematically showing a vertical heat-treating apparatus according to an embodiment of the present invention.

As shown in FIGS. 1 and 2, this apparatus comprises a vertical annealing furnace 1 which includes an airtight reaction tube or process chamber 41 and a heater 42 surrounding the process chamber 41. This process chamber 41 has a double structure comprising an outer tube 41a and an inner tube 41b both made of, e.g., quartz. A plurality of holes 40 are formed at the top of the inner tube 41b, so that the outer tube 41a and the inner tube 41b communicate with each other through these holes 40. A gas supply pipe 5 is connected to a portion near the bottom of the outer tube 41a, and an exhaust pipe 6 is connected to a portion near the bottom of the inner tube 41b. The process chamber 41 is covered with a soaking tube 43. The heater 42 for heating the atmosphere in the process chamber 41 is so disposed as to surround this soaking tube 43.

The gas supply pipe 5 is connected to a reactor 51 for generating water vapor by causing $H_2$ gas (hydrogen gas) to react with $O_2$ gas (oxygen gas). In this embodiment, a combustor for burning hydrogen gas and oxygen gas by heating is used as the reactor 51. However, a device which causes hydrogen gas to react with oxygen gas via a catalyst can also be used as the reactor 51.

The gas supply pipe 5 is also connected to a pipe 52 for supplying nitrogen gas which is mixed with water vapor during oxidation. The gas supply pipe 5 is further connected to a pipe 53 for supplying nitrogen monoxide (NO) gas used in annealing. Furthermore, the gas supply pipe 5 is connected to pipes (not shown) for supplying other gases (e.g., an inactive gas other than nitrogen) as needed. The pipes of these gases are provided with switching valves V1 to V5.

The exhaust pipe 6 is connected to a factory exhaust system 61 and an evacuation system 62. The gas pipes of these systems 61 and 62 are provided with switching valves V11 and V12, respectively.

A wafer boat 2 for supporting semiconductor wafers W as target substrates to be processed is loaded/unloaded as it is vertically moved with respect to the process chamber 41. This wafer boat 2 has a ceiling plate 21, a bottom plate 22, and a plurality of columns 23 for connecting the ceiling plate 21 and the bottom plate 22. A large number of grooves are formed apart from each other in the vertical direction on each column 23. These grooves define a horizontal support level for wafers. By inserting the edges of the wafers W into these grooves, a large number of wafers W are held apart from each other in the vertical direction.

This wafer boat 2 is placed on a heat-insulating cylinder 33 mounted on a lid 32 for opening/closing an opening 31 at the lower end of the process chamber 41. The lid 32 is attached to a boat elevator 3, and this boat elevator 3 raises and lowers the lid 32 to load/unload the wafer boat 2 with respect to the process chamber 41.

In this apparatus, a controller 10 controls the gas supply system (i.e., the switching valves V1 to V5, the reactor 51, and the like), the exhaust system (i.e., the switching valves V11 and V12, the evacuation system 62, and the like), the heater 42, and the boat elevator 3. This controller 10 is so arranged as to perform processing to be described below for the silicon wafers w as target substrates.

Figure 3:
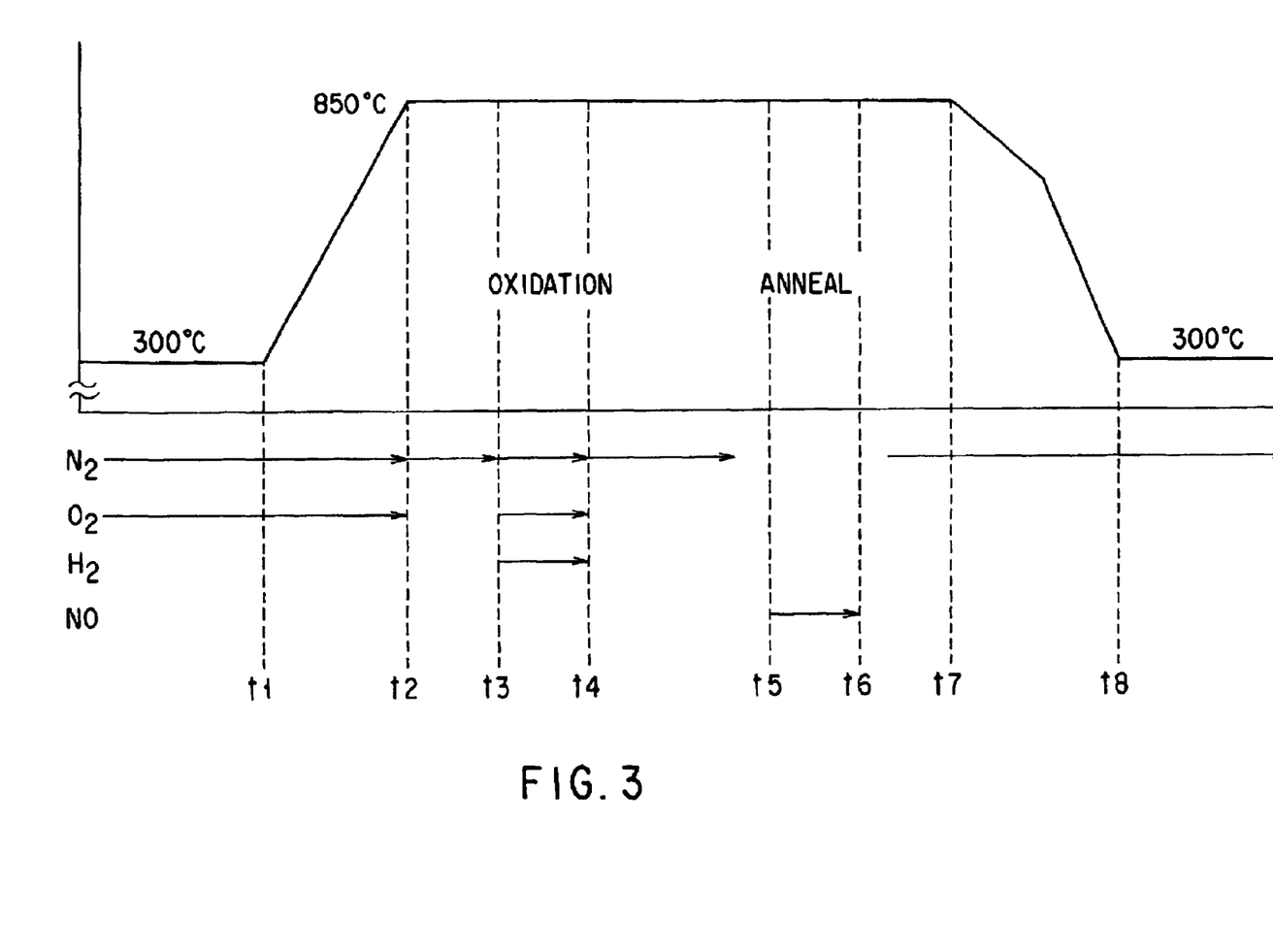
FIG. 3 is a view for explaining the relationship between the temperature and the states of supply or stop of gases in a process chamber.

An insulating film formation method according to the embodiment of the present invention performed using the abovementioned vertical heat-treating apparatus will be described below with reference to FIG. 3. FIG. 3 is a view showing the temperature of an atmosphere in the process chamber 41 and the supply/stop states of processing gases, relative to time.

First, the wafer boat 2 holds a large number of, e.g., 60 silicon wafers W as they are arranged apart from each other in the vertical direction. The boat elevator 3 loads this wafer boat 2 into the process chamber 41 which is previously heated to an initial temperature of from 200 to 600° C., e.g., 300° C. by the heater 42. The opening 31 of the process chamber 41 is airtightly closed with the lid 32 (the state shown in FIG. 2).

Subsequently, the interior of the process chamber 41 is set at a predetermined pressure of from 0.7 Torr to a value of [atmospheric pressure−0.375 Torr], e.g., a value of [atmospheric pressure−0.75 Torr]. After that, from time t1, the interior of the process chamber 41 is heated to a first processing temperature of from 700 to 950° C., e.g., 850° C. at a heating rate of from 50 to 200° C./min, e.g., 100° C./min.

In the step of loading the wafers W and the step of heating the process chamber 41, an inactive gas, e.g., nitrogen gas, and oxygen gas are supplied into the process chamber 41 at 20/0.2 to 5/0.005 SLM (Standard Liter per Minute), e.g., 20/0.1 SLM. The oxygen gas is supplied via the reactor 51 in an inoperative state, while the supply of hydrogen gas is stopped. This oxygen gas is used to prevent nitriding of the surfaces of the wafers W by the nitrogen gas. If the surfaces of the wafers W are once nitrided, these surfaces are not easily oxidized after that.

At time t2 (t2−t1=from 3 to 30 min, e.g., 12.5 min) at which the interior of the process chamber 41 is heated to 850° C. as the first processing temperature, the supply of the oxygen gas is stopped, and the interior of the process chamber 41 is set at a predetermined pressure of from 0.7 Torr to a value of [atmospheric pressure −0.375 Torr]. For example, at the same time the supply of the oxygen gas is stopped, the exhaust system is switched to the factory exhaust system 61 by the switching valves V11 and V12. In this way, the interior of the process chamber 41 is set at a slightly reduced pressure of, e.g., −0.375 to −0.75 Torr with respect to the atmospheric pressure (typically 760 Torr).

After recovery (stabilization of the temperature of the wafers W) is performed in this state, oxidation as a first processing step is performed at time t3 (t3−t2=from 1 to 10 min, e.g., 5 min). In this oxidation, a first processing gas for oxidation is caused to flow into the process chamber 41. This gas contains 1 to 5 vol %, e.g., 1.5 vol % of water vapor (H$_2$O) and 95 to 99 vol %, e.g., 98.5 vol % of nitrogen gas. Also, the interior of the process chamber 41 is set at a first processing pressure of from 0.7 Torr to a value of [atmospheric pressure −0.375 Torr], e.g., 680 Torr. In this manner, the surface of a silicon layer of each wafer W is oxidized to form a silicon oxide film having a thickness of from 1 to 10 nm, e.g., about 3 nm.

In this embodiment, water vapor is generated by supplying oxygen gas and hydrogen gas to the reactor 51 and burning these gases. This water vapor probably more or less contains oxygen gas which has not reacted. In this oxidation, the flow rates of the oxygen gas, hydrogen gas, and nitrogen gas are set at 1/1/20 to 0.4/0.4/30 SLM, e.g., 0.6/0.6/20 SLM.

At time t4 (t4−t3=from 0.5 to 30 min, e.g., 3 min) at which the oxidation completes, cycle purge for preventing the water vapor from remaining in the process chamber 41 is started. In this cycle purge step, the internal pressure of the process chamber 41 is reduced to a pressure of from 1 to 0.01 Torr and then increased to a pressure of from 5 to 20 Torr by an inactive gas such as nitrogen gas. This purge operation is repeated a plurality of number of times, e.g., four times.

More specifically, to perform the cycle purge, the exhaust system is switched to the evacuation system 62 by the switching valves V11 and V12 at time t4. Subsequently, while the evacuation system 62 evacuates the process chamber 41, the supply and stop of an inactive gas such as nitrogen gas are alternately repeated. In this way the interior of the process chamber 41 can be rapidly evacuated and well replaced with the inactive gas. Accordingly, after the wet oxidation, the moisture in the process chamber 41 can be well removed before nitrogen monoxide gas is supplied in annealing to be described later. This can suppress the generation of highly corrosive nitric acid HNO$_3$.

At time t5 (t5−t4=from 10 to 30 min, e.g., 12 min) at which the cycle purge completes, the interior of the process chamber 41 is set at a second processing temperature of from 800 to 950° C., e.g., the same 850° C. as the first processing temperature, and annealing is performed. In this annealing, a second processing gas, which contains 10 to 100 vol %, e.g., 100 vol % of nitrogen monoxide (NO), for nitriding is caused to flow into the process chamber 41. Also, the interior of the process chamber 41 is set at a second processing pressure of from 0.7 to 680 Torr, and desirably from 2 to 300 Torr, e.g., 76 Torr.

In this embodiment, the second processing gas contains only nitrogen monoxide gas, and its flow rate is set at 1 SLM. Although the nitrogen gas is stopped slightly before the annealing starts, the gas can also be continuously used, if necessary, to dilute the nitrogen monoxide gas during the annealing.

By this annealing, nitrogen enters the wet oxide film and terminates dangling bonds in the interface between the silicon wafer W and the wet oxide film, i.e., in the SiO$_2$/Si interface. In other words, at least a portion of the silicon oxide film is converted into silicon oxy-nitride from the interface side. Consequently, the electrical characteristics of the high-quality wet oxide film further improve by the formation of the silicon oxy-nitride.

At time t6 (t6−t5=from 1 to 30 min, e.g., 10 min) at which the annealing completes, the supply of the nitrogen monoxide gas is stopped. Subsequently, the process chamber 41 is evacuated to exhaust the nitrogen monoxide gas. After a short time, the process chamber 41 is evacuated while nitrogen gas is supplied. From time t7 (t7−t6=from 1 to 10 min, e.g., 5 min), the internal temperature of the process chamber 41 is lowered, and the internal pressure of the process chamber 41 is returned to the atmospheric pressure during cooling. At time t8 (t8−t7=from 10 to 40 min, e.g., 26 min) at which the interior of the process chamber 41 is cooled to a predetermined temperature of from 600 to 200° C., e.g., about 300° C., the wafer boat 2 is unloaded from the process chamber 41.

In the above method, a silicon oxide film is obtained by wet oxidation using water vapor. This decreases the stress in a region about, e.g., 1 nm thick in the vicinity of the interface between an underlying silicon layer and a silicon oxide film formed on it. This is presumably because dangling bonds of silicon and oxygen combine with hydrogen to terminate as Si—H or SiO—H.

This silicon oxide film is annealed in a heated atmosphere of nitrogen monoxide. This allows nitrogen obtained by decomposition of the nitrogen monoxide to enter the silicon oxide film and combine with and terminate the dangling bonds. As a consequence, the number of the dangling bonds in the interface between the silicon oxide film and the silicon layer further decreases, and this lowers the interface state density.

As described above, in wet oxidation, the dangling bonds in the interface are terminated by hydrogen and hence are originally few. Annealing further reduces these dangling bonds. Therefore, an insulating film which is formed on the silicon wafer W by the above method, consists primarily of silicon oxide, and partially contains silicon oxy-nitride hardly causes dielectric breakdown and also has improved leakage characteristics.

In the above method, after being oxidized the wafers W are annealed at, e.g., the same temperature as the oxidation without being unloaded from the process chamber 41. This reduces accumulation of the heat history of the wafers W and improves the film quality of the insulating film because no atmospheric oxygen is incorporated. Also, in the oxidation, the oxidation rate can be appropriately lowered since water vapor is diluted by nitrogen gas. Accordingly, it is possible to obtain a thin insulating film while ensuring the film thickness uniformity among the wafers W (among the surfaces) on the wafer boat 2 and the film thickness uniformity (on the surface) of a single wafer W.

The processing temperature (the temperature of the surface of the wafer W placed in the processing atmosphere) in the oxidation is preferably 700° C. to 950° C. If the processing temperature is less than 700° C., the number of the dangling bonds in the interface with the insulating film increases, and the electrical characteristics suffer. If the processing temperature exceeds 950° C., nitrogen as a dilute gas reacts to damage the surface of the silicon oxide film.

When annealing is performed by nitrogen monoxide, the processing temperature is preferably 800° C. to 950° C. If the processing temperature is less than 800° C., the interface state density increases as will be described later, so no good electrical characteristics can be obtained. If the processing temperature exceeds 950° C., too much nitrogen is incorporated into the insulating film. If this insulating film is used as, e.g., the gate insulating film of a P-MOS transistor, a channel current is reduced. The film is also disadvantageous in that the heat history accumulates.

The processing pressure in the annealing is set at a value of desirably from 0.7 to 680 Torr, and more desirably from 2 to 300 Torr. As will be described later, this pressure range is chosen to set the nitrogen concentration in the formed insulating film to a value of from 1 to 10 atm %, and desirably form 1 to 3 atm %. If the nitrogen concentration is as low as less than 1 atm %, problems arise: e.g., boron (B) as a dopant of a p$^+$-polysilicon electrode penetrates to the substrate through the insulating film, and the breakdown voltage lowers. If the nitrogen concentration is too high, the transistor characteristic, e.g., the carrier mobility worsens.

[Experiment1]

In the process chamber 41, oxidation was performed for 3 min at 850° C. and 760–0.75=759.25 Torr while hydrogen gas, oxygen gas, and nitrogen gas were supplied at flow rates of 0.6, 0.6, and 20 SLM, respectively, thereby forming 2-nm thick silicon oxide films on silicon wafers. Subsequently, in this process chamber 41, the silicon oxide films on the silicon wafers were annealed at 76 Torr for 10 min while nitrogen monoxide was supplied at a flow rate of 1 SLM. The annealing temperature was set at four different temperatures, i.e., 850° C., 800° C., 700° C., and 550° C.

For each of insulating films obtained by the individual processes and consisting primarily of silicon oxide, the interface state density in the interface between the silicon layer and the insulating film was measured at five points on the wafer surface by using an interface state measuring device (QUANTOX™ (trade name: manufactured by KLA Tencor)). Similar measurements were also performed for an insulating film not annealed.

Figure 4:
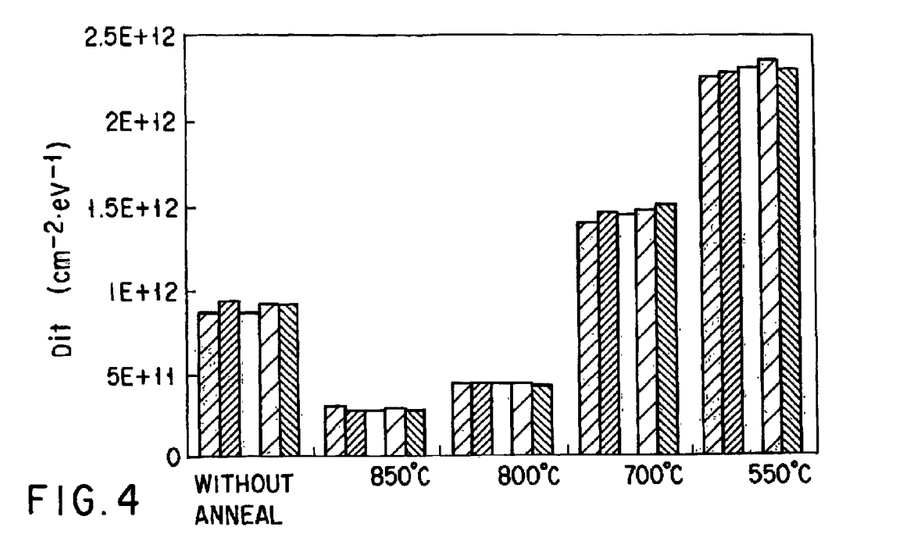
FIG. 4 is a graph showing the relationships between the temperatures of annealing using nitrogen monoxide and the interface state densities of insulating films.

FIG. 4 is a graph showing the results obtained by experiment 1, i.e., the relationship between the annealing temperature and the interface state density (Dit) of each insulating film. Referring to FIG. 4, the numerals plotted on the abscissa indicate annealing temperatures. For example, a portion indicated by "850° C." shows data from annealing performed at this temperature. Also, five bars in each condition correspond to the five measurement points on the wafer surface.

As shown in FIG. 4, the interface state density of each insulating film annealed at a temperature of 700° C. or less was larger than that of the insulating film not annealed. That is, annealing at 700° C. or less deteriorated the film quality rather than having no effect. In contrast, the interface state densities of the insulating films processed at 800° C. and 850° C. lowered. That is, the processing temperature is an important process parameter of annealing, and a temperature range within which good film quality is obtained exists.

[Experiment 2]

In the process chamber 41, oxidation was performed for 6.5 min at 850° C. and 760–0.75=759.25 Torr while hydrogen gas, oxygen gas, and nitrogen gas were supplied at flow rates of 0.6, 0.6, and 20 SLM, respectively, thereby forming 2.6-nm thick silicon oxide films on silicon wafers. Subsequently, in this process chamber 41, the silicon oxide films on the silicon wafers were annealed at 850° C. for 10 min while nitrogen monoxide was supplied at a flow rate of 1 SLM. The annealing pressure was set at five different pressures, i.e., 0.5, 1.2, 8, 12.1, and 76 Torr.

For each of insulating films obtained by the individual processes and consisting primarily of silicon oxide, the difference between the film thickness after the oxidation and that after the annealing, i.e., the film thickness increased by the formation of silicon oxy-nitride was measured. Also, the nitrogen concentration in each insulating film was measured.

Figure 5:
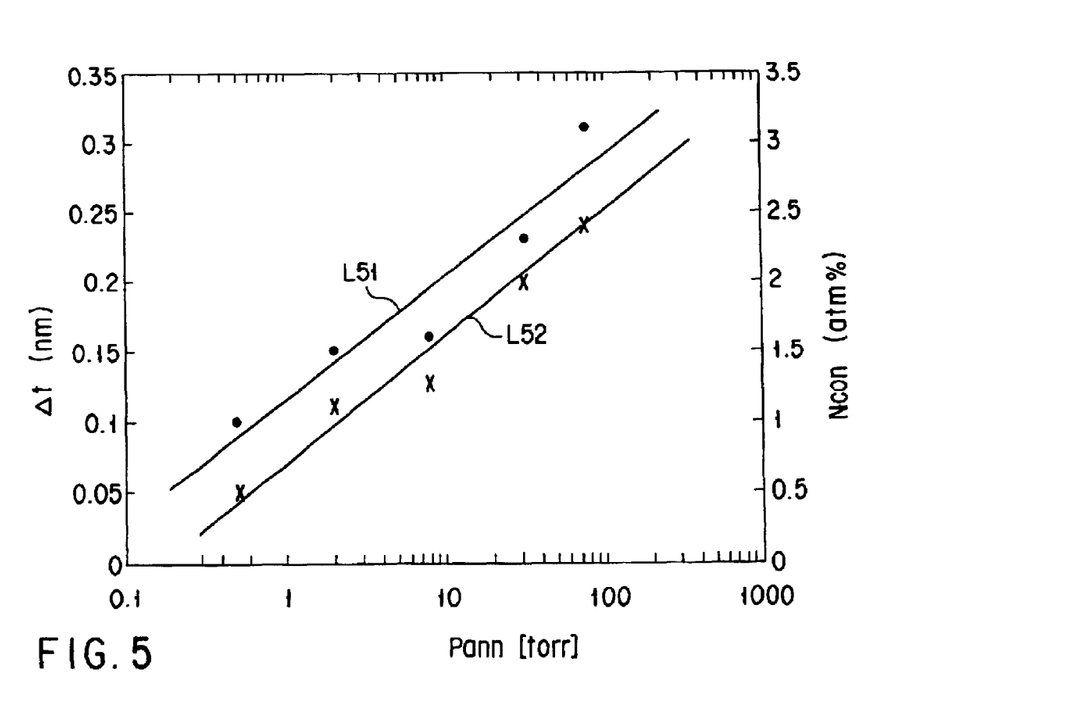
FIG. 5 is a graph showing the relationship between the pressure of annealing using nitrogen monoxide, and the increased film thickness and nitrogen concentration of an insulating film.

FIG. 5 is a graph showing the results obtained by experiment 2, i.e., the relationship between the annealing pressure (Pann) and the increased film thickness (Δt) and nitrogen concentration (Ncon) of each insulating film. Referring to FIG. 5, lines L51 and L52 indicate the increased film thickness and the nitrogen concentration, respectively. Note that atm % of Ncon means the ratio of the number of nitrogen atoms to the total number of atoms contained in a unit volume.

As shown in FIG. 5, both the increased film thickness and the nitrogen concentration increased in proportion to the logarithmic value of the pressure. Also, in controlling the nitrogen concentration in an insulating film with high reproducibility, the controllability was improved by changing the annealing pressure. That is, the processing pressure is an important process parameter of annealing, and high film quality is obtained depending on the pressure range without changing the annealing time.

[Experiment 3]

Oxidation and annealing were performed under the same conditions as in experiment 1 by setting the temperature of nitrogen monoxide annealing at 800° C. and 850° C., thereby forming insulating film samples S61 and S62, respectively, on silicon wafers. Also, as an example using dry oxidation, oxidation and annealing were performed under the same conditions as for sample S62 (i.e., annealing temperature=850° C.) except that only oxygen gas was supplied at a flow rate of 10 SLM during the oxidation, thereby forming an insulating film sample S63 on a silicon wafer.

90% Qbd of each of the samples S61 to S63 obtained by the above processes was measured. This 90% Qbd is the value of an electric charge amount, per unit area, which has passed through insulating films before 90% or more of 100 chips respectively having the insulating films cause dielectric breakdown, when an electric current is caused to flow through each insulating film in the direction of thickness of the insulating film by a constant current source.

Figure 6:
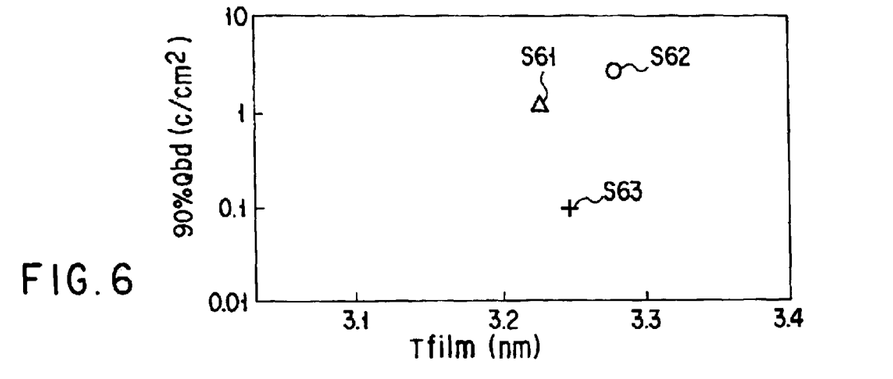
FIG. 6 is a graph showing the comparison of the dielectric breakdown characteristics of an insulating film formed by wet oxidation and an insulating film formed by dry oxidation.

FIG. 6 is a graph showing the results obtained by experiment 3, i.e., the comparison of the dielectric breakdown characteristics (90% Qbd) of the insulating films obtained by wet oxidation with that of the insulating film obtained by dry oxidation. Referring to FIG. 6, the abscissa indicates the film thickness (Tfilm) of each insulating film. "Δ", "○", and "+" indicate the results of the samples S61, S62, and S63, respectively.

As shown in FIG. 6, the samples S61 and S62 obtained by wet oxidation had dielectric breakdown characteristics far superior to that of sample S63 obtained by dry oxidation. Note that the difference between the characteristics of the samples S61 and S62 was probably produced because generally the smaller the film thickness the worse the insulating breakdown characteristic in a range of a film thickness of 3.0 nm or more.

[Experiment 4]

Silicon oxide films were formed on silicon wafers by performing oxidation under the same conditions as in experiment 1 except the processing time. Three different processing times were set for this oxidation such that the film thicknesses of the silicon oxide films were 2.0, 2.5, and 3.0 nm. Subsequently, annealing was performed for the silicon oxide films on the silicon wafers under the same conditions as in experiment 1 by setting the annealing temperature at 850° C.

For each of insulating films obtained by the above processes and consisting primarily of silicon oxide, the concentrations of nitrogen and oxygen in the film were measured by SIMS (Secondary Ion Mass Spectroscopy).

Figure 7:
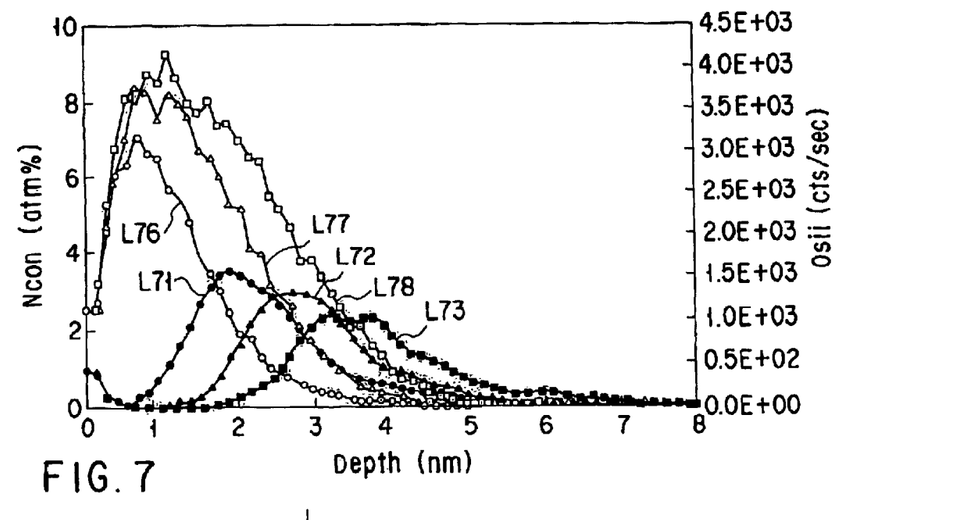
FIG. 7 is a graph showing the concentration profiles of nitrogen and oxygen, examined by SIMS (Secondary Ion Mass Spectrometry), of insulating films according to the embodiment of the present invention.

FIG. 7 is a graph showing the results obtained by experiment 4, i.e., the profiles of the nitrogen and oxygen concentrations in the insulating films according to the embodiment of the present invention. Referring to FIG. 7, the abscissa indicates the depth (Depth) from the surface of the insulting film, the left-hand ordinate indicates the nitrogen concentration (Ncon), and the right-hand ordinate indicates the oxygen secondary ion intensity (Osii). Also, lines L71, L72, and L73 indicate the nitrogen concentrations when the film thicknesses of the silicon oxide films were 2.0, 2.5, and 3.0 nm, respectively. Lines L76, L77, and L78 indicate the oxygen secondary ion intensities when the film thicknesses of the silicon oxide films were 2.0, 2.5, and 3.0 nm, respectively. Note that atm % for Ncon means the ratio of the number of nitrogen atoms to the total number of atoms contained in a unit volume.

As shown in FIG. 7, the oxygen concentration peaks were found near the surfaces of the insulating films, and the nitrogen concentration peaks were found in the interfaces between the insulating films and the silicon layers. Also, the nitrogen concentration rose as the film thickness decreased. Accordingly, the method according to the embodiment of the present invention is particularly effective to thin insulating films.

[Experiment 5]

Oxidation and annealing were performed under the same conditions as in experiment 1 by setting the temperature of nitrogen monoxide annealing at 850° C., thereby forming a 3.2-nm thick insulating film sample S81 on a silicon wafer. Also, oxidation and annealing were performed under the same conditions as for the sample S81 except that dinitrogen monoxide ($N_2O$) gas was used instead of nitrogen monoxide (NO) gas as the annealing gas, thereby forming a 3.1-nm thick insulating film sample S82 on a silicon wafer.

The concentrations of nitrogen in the films of the samples S81 and S82 obtained by the above processes were measured by SIMS.

Figure 8:
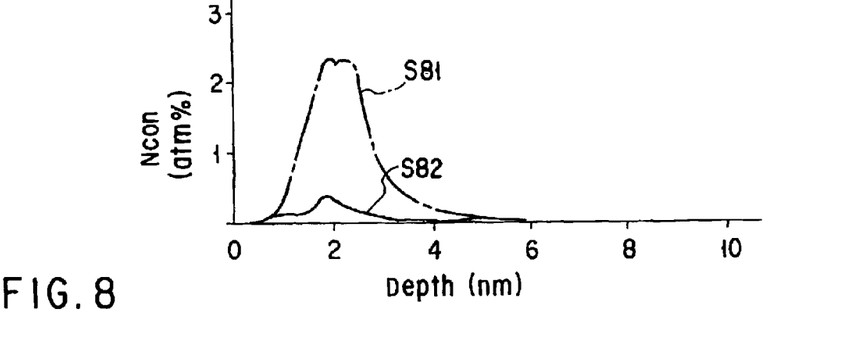
FIG. 8 is a graph showing the nitrogen concentration profiles, examined by SIMS, of an insulating film according to the embodiment of the present invention and an insulating film obtained by a comparative method.

FIG. 8 is a graph showing the results obtained by experiment 3, i.e., the profile of the nitrogen concentration in the insulating film according to the embodiment of the present invention and that in the insulting film obtained by the comparative method. Referring to FIG. 8, the abscissa indicates the depth (Depth) from the surface of the insulating film, and the ordinate indicates the nitrogen concentration (Ncon). The alternate long and short dashed lines indicate the result of the sample S81, and the solid line indicates the result of the sample S82.

As shown in FIG. 8, the nitrogen concentration of the sample S81 annealed using nitrogen monoxide gas was much higher than that of the sample S82 annealed using dinitrogen monoxide. Accordingly, the use of nitrogen monoxide is advantageous in introducing a large amount of nitrogen into an insulating film. This is presumably because highly decomposable dinitrogen monoxide partially separates into O radicals to allow simultaneous progress of oxidation and nitriding, so the incorporated amount of nitrogen becomes smaller than when nitrogen monoxide is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming an insulating film containing silicon oxy-nitride, comprising:

a loading step of loading a target substrate into a process chamber, the substrate having an exposed silicon layer surface, the loading step being started from a state where an atmosphere in the process chamber is set at an initial temperature of 200 to 600° C.;

a temperature raising step, after the loading step, of raising the atmosphere in the process chamber from the initial temperature to a first heating temperature of 700 to 950° C., while supplying nitrogen gas and oxygen gas at a supply ratio of 100:1 to 1000:1 into the process chamber to form the atmosphere in the process chamber, thereby using the oxygen gas to prevent the silicon layer surface from being nitrided by the nitrogen gas;

an oxidation step, after the temperature raising step, of setting the atmosphere in the process chamber at the first heating temperature and a first pressure for a first processing time, and supplying a first processing gas for oxidation into the process chamber to oxidize the silicon layer surface, thereby forming a silicon oxide film, the first processing gas containing 1 to 5 vol % of water vapor and 95 to 99 vol % of nitrogen gas;

a cycle purge step, after the oxidation step, of performing a purge operation of the process chamber a plurality of number of times to prevent the water vapor from remaining; and an annealing step, after the cycle purge step, of setting the atmosphere in the process chamber at a second heating temperature and a second pressure for a second processing time, and supplying a second processing gas for nitriding into the process chamber to convert at least a portion of the silicon oxide film into silicon oxy-nitride, the second heating temperature being 800 to 950° C., and the second processing gas containing 10 to 100 vol % of nitrogen monoxide gas.

2. The method according to claim 1, wherein the loading step is performed while supplying nitrogen gas and oxygen gas at a supply ratio of 100:1 to 1000:1 into the process chamber to form the atmosphere in the process chamber.

3. The method according to claim 1, wherein, in the temperature raising step, temperature raising is performed from the initial temperature to the first heating temperature at 50 to 200° C./min.

4. The method according to claim 1, wherein the water vapor is generated by supplying oxygen gas and hydrogen gas to a reactor connected to the process chamber and causing the oxygen gas to react with the hydrogen gas.

5. The method according to claim 4, wherein, in the temperature raising step, the oxygen gas is supplied through the reactor, which is supplied with no hydrogen gas and is not in operation.

6. The method according to claim 1, wherein, in the cycle purge step, the pressure in the process chamber is reduced to 1 to 0.01 Torr and then increased to 5 to 20 Torr by an inactive gas.

7. The method according to claim 6, wherein, from the oxidation step to the annealing step through the cycle purge step, a heater disposed around a sidewall of the process chamber keeps heating the atmosphere in the process chamber through the sidewall.

8. The method according to claim 1, wherein the second pressure is 0.7 to 680 Torr.

9. The method according to claim 8, wherein the second processing time is 1 to 30 min.

10. The method according to claim 8, wherein the second pressure is 2 to 300 Torr.

11. The method according to claim 10, wherein the second pressure is selected to set a nitrogen concentration in the insulating film to a value of 1 to 10 atm %.

12. The method according to claim 11, wherein the silicon oxide film has a thickness of 1 to 10 nm.

13. The method according to claim 1, wherein the first pressure is 0.7 to 759.625 Torr.

14. The method according to claim 13, wherein the first processing time is 0.5 to 30 min.

15. A method of forming an insulating film containing silicon oxy-nitride, comprising:

a loading step of loading a target substrate into a process chamber, the substrate having an exposed silicon layer surface, the loading step being started from a state where an atmosphere in the process chamber is set at an initial temperature of 200 to 600° C.;

a temperature raising step, after the loading step, of raising the atmosphere in the process chamber from the initial temperature to a first heating temperature of 700 to 950° C. while supplying nitrogen gas and oxygen gas at a supply ratio of 100:1 to 1000:1 into the process chamber to form the atmosphere in the process chamber, thereby using the oxygen gas to prevent the silicon layer surface from being nitrided by the nitrogen gas;

an oxidation step, after the temperature raising step, of setting the atmosphere in the process chamber at the first heating temperature and a first pressure for a first processing time, and supplying a first processing gas for oxidation into the process chamber to oxidize the silicon layer surface, thereby forming a silicon oxide film, the first processing gas containing 1 to 5 vol % of water vapor and 95 to 99 vol % of nitrogen gas, the first pressure being 0.7 to 759.625 Torr;

a cycle purge step, after the oxidation step, of performing a purge operation of the process chamber a plurality of number of times to prevent the water vapor from remaining; and an annealing step, after the cycle purge step, of setting the atmosphere in the process chamber at a second heating temperature and a second pressure for a second processing time, and supplying a second processing gas for nitriding into the process chamber to convert at least a portion of the silicon oxide film into silicon oxy-nitride, the second heating temperature being 800 to 950° C., and the second processing gas containing 10 to 100 vol % of nitrogen monoxide gas, the second pressure being 2 to 300 Torr and selected to set a nitrogen concentration in the insulating film to a value of 1 to 10 atm %.

16. The method according to claim 15, wherein the second pressure is selected to set the nitrogen concentration in the insulating film to a value of 1 to 3 atm %.

17. The method according to claim 15, wherein the silicon oxide film has a thickness of 1 to 10 nm.

18. The method according to claim 15, wherein the loading step is performed while supplying nitrogen gas and oxygen gas at a supply ratio of 100:1 to 1000:1 into the process chamber to form the atmosphere in the process chamber.

19. A method of forming an insulating film containing silicon oxy-nitride, comprising:

a loading step of loading a holder, on which a plurality of target substrates are placed apart from each other in a vertical direction, into a process chamber, each substrate having an exposed silicon layer surface, the loading step being started from a state where an atmosphere in the process chamber is set at an initial temperature of 200 to 600° C.;

a temperature raising step, after the loading step, of raising the atmosphere in the process chamber from the initial temperature to a first heating temperature of 700 to 950° C., while supplying nitrogen gas and oxygen gas at a supply ratio of 100:1 to 1000:1 into the process chamber to form the atmosphere in the process chamber, thereby using the oxygen gas to prevent the silicon layer surface from being nitrided by the nitrogen gas;

an oxidation step, after the temperature raising step, of setting the atmosphere in the process chamber at the first heating temperature and a first pressure for a first processing time, and supplying a first processing gas for oxidation into the process chamber to oxidize the silicon layer surface, thereby forming a silicon oxide film, the first processing gas containing 1 to 5 vol % of water vapor and 95 to 99 vol % of nitrogen gas, the first pressure being 0.7 to 759.625 Torr;

a cycle purge step, after the oxidation step, of performing a purge operation of the process chamber a plurality of number of times to prevent the water vapor from remaining; and an annealing step, after the cycle purge step, of setting the atmosphere in the process chamber at a second heating temperature and a second pressure for a second processing time, and supplying a second processing gas for nitriding into the process chamber to convert at least a portion of the silicon oxide film into silicon oxy-nitride, the second heating temperature being 800 to 950° C., and the second processing gas containing 10 to 100 vol % of nitrogen monoxide gas, the second pressure being 0.7 to 680 Torr.

20. The method according to claim 19, wherein the loading step is performed while supplying nitrogen gas and oxygen gas at a supply ratio of 100:1 to 1000:1 into the process chamber to form the atmosphere in the process chamber.

* * * * *